United States Patent
Ballarin

(10) Patent No.: US 7,560,196 B2
(45) Date of Patent: Jul. 14, 2009

(54) MASK FOR EXPOSING AN ALIGNMENT MARK, AND METHOD AND COMPUTER PROGRAM FOR DESIGNING THE MASK

(75) Inventor: Eugenio Guido Ballarin, Milan (IT)

(73) Assignee: ASML Netherlands B.V., Veldhoven (NL)

( * ) Notice: Subject to any disclaimer, the term of this patent is extended or adjusted under 35 U.S.C. 154(b) by 827 days.

(21) Appl. No.: 10/998,959

(22) Filed: Nov. 30, 2004

(65) Prior Publication Data

US 2005/0084772 A1 Apr. 21, 2005

Related U.S. Application Data

(62) Division of application No. 10/151,313, filed on May 21, 2002, now Pat. No. 6,876,092.

(30) Foreign Application Priority Data

May 23, 2001 (EP) .................................. 01201956

(51) Int. Cl.
G03F 7/00 (2006.01)
(52) U.S. Cl. ............................ 430/5; 430/311; 430/319; 430/22; 716/19; 716/21; 356/614; 250/398
(58) Field of Classification Search ...................... 430/5, 430/311, 319; 716/21, 19
See application file for complete search history.

(56) References Cited

U.S. PATENT DOCUMENTS

| 5,059,808 A | * | 10/1991 | Tarui et al. ................... 250/548 |
| 5,151,750 A | | 9/1992 | Magome et al. |
| 5,525,840 A | | 6/1996 | Tominaga |
| 5,532,091 A | | 7/1996 | Mizutani |
| 5,910,847 A | * | 6/1999 | Van der Werf et al. ...... 356/401 |
| 5,917,205 A | | 6/1999 | Mitsui et al. |
| 6,037,671 A | | 3/2000 | Kepler et al. |
| 6,064,486 A | * | 5/2000 | Chen et al. ................... 356/401 |
| 6,093,640 A | | 7/2000 | Hsu et al. |
| 6,137,186 A | | 10/2000 | Jost et al. |
| 6,165,656 A | | 12/2000 | Tomimatu |

(Continued)

FOREIGN PATENT DOCUMENTS

EP 0 389 209 A2 9/1990

(Continued)

OTHER PUBLICATIONS

Translation of Foreign Office Action issued for Taiwan Patent Application No. 091110513, dated Oct. 26, 2005.

(Continued)

Primary Examiner—Mark F Huff
Assistant Examiner—Rashid Alam
(74) Attorney, Agent, or Firm—Pillsbury Winthrop Shaw Pittman LLP

(57) ABSTRACT

A mask provided with an alignment mark is presented. That mask includes at least one relatively high reflectance area(s) for reflecting radiation of an alignment beam of radiation, and relatively low reflectance areas for reflecting less radiation of the alignment beam, wherein the high reflectance area(s) is (are) segmented in first and second directions both directions being substantially perpendicular with respect to each other so that the high reflectance areas include predominantly rectangular segments.

35 Claims, 2 Drawing Sheets

U.S. PATENT DOCUMENTS

| | | |
|---|---|---|
| 6,180,498 B1 | 1/2001 | Geffken et al. |
| 6,277,658 B1 | 8/2001 | Jeng et al. |
| 6,297,876 B1 | 10/2001 | Bornebroek |
| 6,301,001 B1 | 10/2001 | Unno |
| 6,342,735 B1 | 1/2002 | Colelli et al. |
| 2003/0026471 A1 | 2/2003 | Adel et al. |
| 2004/0099963 A1 | 5/2004 | Holloway et al. |

FOREIGN PATENT DOCUMENTS

| | | |
|---|---|---|
| EP | 0 389 209 A3 | 9/1990 |
| EP | 0 997 782 A1 | 5/2000 |
| EP | 1 162 507 A | 12/2001 |
| JP | 3-3224 A | 1/1991 |
| JP | 4-303915 A | 10/1992 |
| JP | 4-330710 A | 11/1992 |
| JP | 6-120117 A | 4/1994 |
| JP | 7-221166 A | 8/1995 |
| JP | 9-162102 A | 6/1997 |
| JP | 2001-44105 A | 2/2001 |

OTHER PUBLICATIONS

Marc J. Madou, "Fundamentals of microfabrication", ISBN 0-8493-9451-1, pp. 23 and 26 (1997).

Translation of Japanese Office Action issued in Japanese Appln. No. 2002-182180 mailed Aug. 1, 2006.

European Search Report for Application No. 01201956.8, dated Dec. 21, 2001.

European Search Report for Application No. 03077203.2, dated Jun. 24, 2004.

Translation of Japanese Office Action issued in Japanese Appln. No. 2002-182180 mailed Aug. 1, 2006.

* cited by examiner

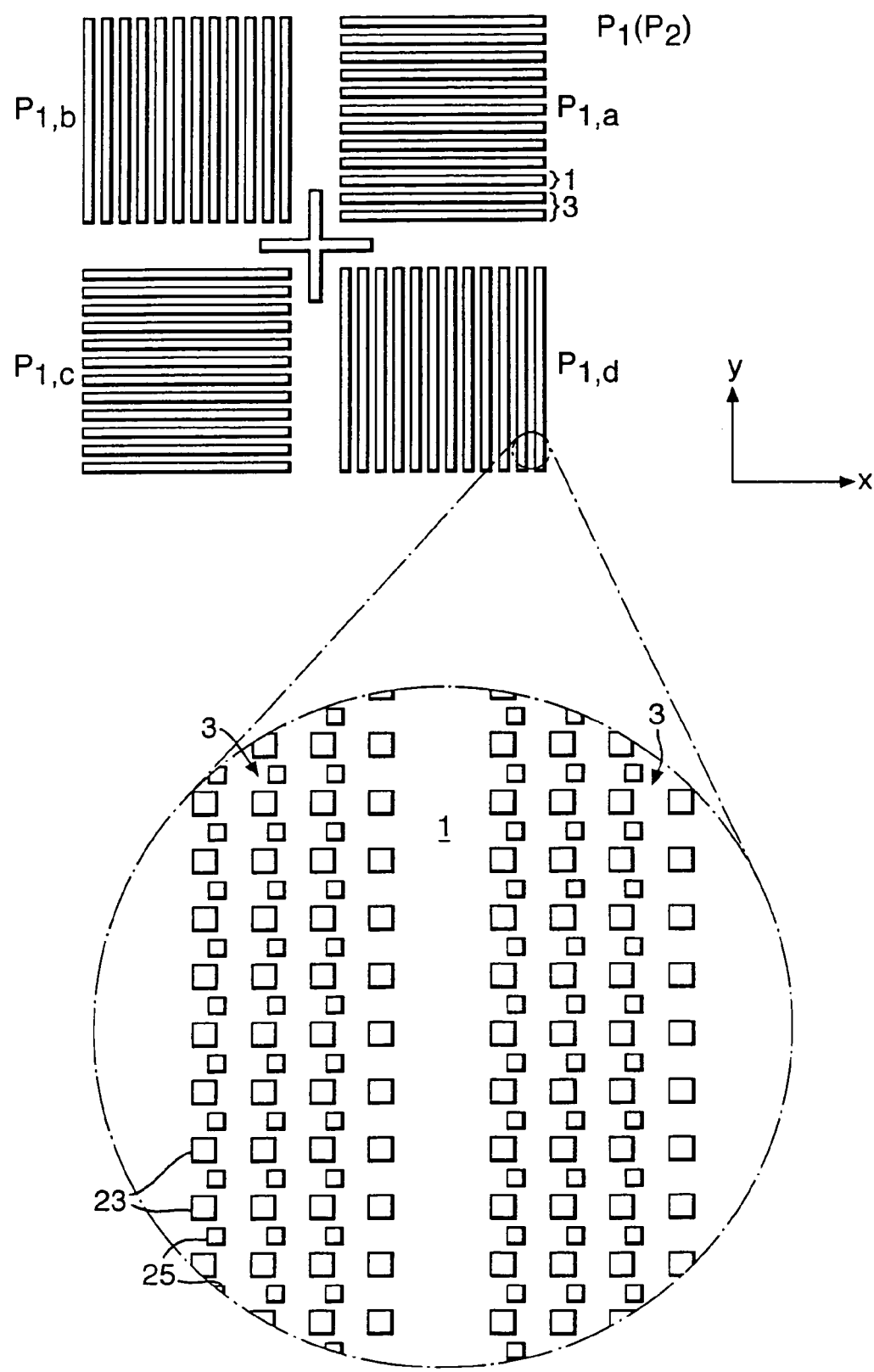

MASK FOR EXPOSING AN ALIGNMENT MARK, AND METHOD AND COMPUTER PROGRAM FOR DESIGNING THE MASK

This application is a divisional application of U.S. application Ser. No. 10/151,313, filed May 21, 2002, now U.S. Pat. No. 6,876,092, which in turn claims priority from EP 01201956.8 filed May 23, 2001, herein incorporated by reference

FIELD

The present invention relates to alignment marks.

BACKGROUND

In general, a substrate may be processed in a lithographic projection apparatus comprising a radiation system to supply a projection beam of radiation; a support structure to support patterning structure, the patterning structure serves to pattern the projection beam according to a desired pattern; a substrate table to hold a substrate; and a projection system to project the patterned beam onto a target portion of the substrate.

The term "patterning structure" as here employed should be broadly interpreted as referring to structure or means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-0672504, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, incorporated herein by reference.

This invention relates to an alignment mark for use in an alignment system of a lithographic projection apparatus for aligning the pattern in the patterning structure to the substrate. An alignment system, for example, the indirect off-axis alignment system described in PCT patent application WO 98/39689 incorporated herein by reference, employs an alignment beam of radiation that is radiated by a separate alignment unit and that is incident on a mark, in the form of a grating on the substrate. The grating diffracts the alignment beam into a number of sub-beams extending at different angles to the normal of the grating. Said distinct sub-beams will be directed with a lens of the alignment unit to different positions in a plane. In this plane means may be provided for further separating the different sub-beams. The lens system will also be used to finally image the different sub-beams on a reference plate to create an image of the mark. In this reference plate a reference mark can be provided and a radiation sensitive detector can be arranged behind the reference mark. The output signal of the detector will be dependent on the extent to which the image of the substrate mark and the reference mark coincide. In this way the extent of alignment of the mark on the substrate with the reference mark in the alignment unit can be measured and optimized. The detector may comprise separate individual detectors for measuring the intensity and the aligned position at different orders. To finish the alignment, the reference in the alignment unit has to be aligned to a second reference mark, for example, one provided to the substrate table with the alignment unit. This second reference mark may then be aligned to a mark in the mask using exposure light. An apparatus and method as described in U.S. Pat. No. 5,144,363, incorporated herein by reference can be used for that purpose.

Alternatively, a direct on-axis alignment system can be used that directs an alignment beam directly upon a mark provided on the substrate via the projection system. This beam will be diffracted by the mark on the substrate into different sub-beams and will be reflected into the projection system. After traversing the projection system the different sub-beams will be focussed on a reference alignment mark provided to the mask. The image of the substrate mark formed by the sub-beams can be imaged upon the reference mark in the mask. In this way the extent of alignment of the mark on the substrate and the reference mark in the mask can be measured and optimized. This can be done by using a radiation sensitive detector constructed and arranged to detect the alignment beam traversing the mark in the mask. For more information with respect to the on-axis alignment system here described see, for example, U.S. Pat. No. 4,778,275 incorporated herein by reference.

SUMMARY

In an aspect of at least one embodiment of the present invention, there is provided an alignment mark that exhibits comparable positional errors as a wide variety of pattern types and can be aligned with existing alignment tools.

According to at least one embodiment of the invention, a substrate is provided with an alignment mark in a substantially transmissive process layer overlying the substrate, said mark comprising:
- at least one relatively high reflectance area(s) for reflecting radiation of an alignment beam of radiation; and
- relatively low reflectance areas for reflecting less radiation of the alignment beam, wherein the high reflectance area(s) is (are) segmented in first and second directions both directions being substantially perpendicular with respect to each other so that the high reflectance areas comprise predominantly rectangular segments.

According to at least one embodiment of the invention, there is provided a mask containing a pattern for exposing an alignment mark as described above.

According to at least one embodiment, the mask of the invention may be made by a method of designing a mask to be used in projecting a mask pattern onto a substrate in a lithographic projection apparatus, the mask including at least one alignment mark, the alignment mark comprising relatively high reflectance areas and relatively low reflectance areas, the method comprising:
- determining the position in the pupil plane of the projection system of said lithographic projection apparatus of the different diffraction orders of at least one structure in said mask pattern;
- determining an appropriate segmentation of said high reflectance areas of said alignment mark such as to cause different diffraction orders of the alignment mark to be positioned at substantially the same positions in said pupil plane as said different diffraction orders of said at least one structure; and
- altering the pattern of said alignment mark in said mask pattern so as to be segmented as determined to be appropriate.

According to at least one embodiment of the invention, there is provided a device manufacturing method comprising:
- providing a substrate comprising alignment marks comprising high reflectance and low reflectance areas in a transmissive layer that is at least partially covered by a layer of radiation sensitive material to a substrate table;
- aligning the alignment marks to a reference with an alignment beam of radiation;
- providing a projection beam of radiation using a radiation system;
- using patterning structure to endow the projection beam with a pattern in its cross-section, and
- projecting the patterned beam of radiation onto a target portion of the layer of radiation sensitive material, wherein the high reflectance areas are segmented in first and second directions both directions being substantially perpendicular with respect to each other so that the high reflectance area(s) comprise predominantly rectangular segments.

Although specific reference may be made in this text to the use of the apparatus according to at least one embodiment of the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer", "target area" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts and in which:

FIG. 2 depicts an alignment mark, with a part enlarged, according to at least one embodiment of the invention.

DETAILED DESCRIPTION

Figure 1:
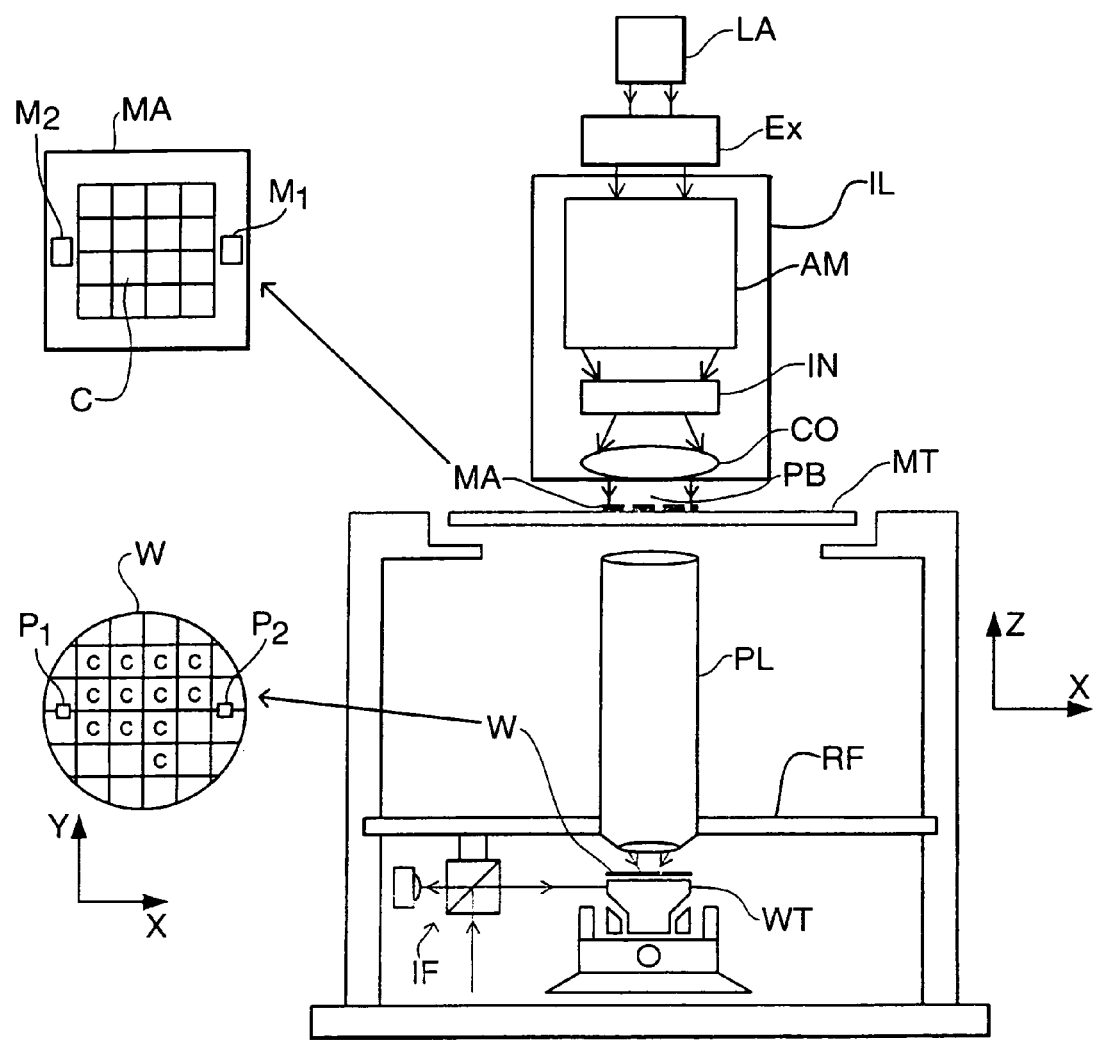
FIG. 1 depicts a lithographic projection apparatus wherein at least one embodiment of the invention can be used.

FIG. 1 schematically depicts a lithographic projection apparatus wherein the substrate provided with the mark according to at least one embodiment of the invention can be used. The apparatus comprises:
 a radiation system Ex, IL, for supplying a projection beam PB of radiation (e.g. UV or EUV radiation). In this particular case, the radiation system also comprises a radiation source LA;
 a first object table (mask table) MT provided with a mask holder for holding a mask MA (e.g. a reticle), and connected to first positioning means for accurately positioning the mask with respect to item PL;
 a second object table (substrate table) WT provided with a substrate holder for holding a substrate W (e.g. a resist-coated silicon wafer), and connected to second positioning means for accurately positioning the substrate with respect to item PL; and
 a projection system ("lens") PL (e.g. a refractive or catadioptric system, a mirror group or an array of field deflectors) for imaging an irradiated portion of the mask MA onto a target portion C (e.g. comprising one or more dies) of the substrate W. As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source LA (e.g. a HG lamp, an excimer laser, an undulator provided around a path of an electron beam in a storage ring or synchrotron) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:
1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

For alignment purposes, the mask is provided with marks ($M_1$ and $M_2$) in the mask MA. These marks ($M_1$ and $M_2$) may be aligned directly or indirectly through the projection system PL to marks ($P_1$ and $P_2$) in the substrate W. During this alignment information will be obtained about the position of the image C projected through the projection system PL upon the substrate W. This is necessary to assure that different layers exposed with different masks are correctly positioned with respect to each other. It is therefore necessary that before exposure of each layer the image in the mask MA is aligned to the same substrate marks ($P_1$ and $P_2$).

FIG. 2 depicts a substrate alignment mark according to at least one embodiment of the invention. Such an alignment mark may comprise four sub-gratings $P_{1,a}$, $P_{1,b}$, $P_{1,c}$ and $P_{1,d}$, of which the sub-gratings $P_{1,b}$ and $P_{1,d}$ serve for alignment in the X direction and the sub-gratings $P_{1,a}$ and $P_{1,c}$ serve for alignment in the Y direction. The sub-gratings may have a grating period of, for example, 16 µm. The grating period may be different for each sub-grating and the dimensions of the sub-grating may be 200*200 µm. Each sub-grating comprises reflective areas 3 and low-reflective areas 1.

As shown in the enlargement, the reflective areas 3 are built up out of square reflective segments, each square being repeated in first and second directions and having sides parallel to said first and second direction. As shown here there are two types of square surfaces—large ones 23 and small ones 25—which are repeated to form the reflective area 3. The size of the squares should be comparable with the size of the structures that are exposed from the mask onto the substrate and there might also be more sizes of squares used. A comparable size of the squares in the reflective area of the mark and the structure to be exposed is advantageous because the diffraction by structures to be exposed is in that case similar to the diffraction by reflective areas of the mark. An advantage of this similar diffraction is that beams with a similar diffraction will traverse a similar optical path through the projection system and therefore will suffer from the same aberrations in the projection system. The positional deviation caused by those aberrations will be similar for the alignment mark and the structures to be exposed leading to a better-aligned position. The size of the squares may be in the range from 0.05 to 0.5 µm.

By segmenting the relatively high reflectance areas of the alignment mark into rectangular sub-divisions, the mark can be arranged to diffract light into similar positions in the pupil plane of the projection lens as structures in the mask pattern. The image of the alignment mark projected onto the wafer will therefore suffer from the same aberrations as the image of the structures of the mask pattern and thus the position of the mark on the substrate will be a better representation of the position of patterned features, enabling a more accurate measurement of overlay errors. Because each part of the high reflectance area is segmented in two directions into rectangular pieces, the whole mark experiences the same aberrations. Also, the pupil plane is fully sampled because there is diffraction in two orthogonal directions.

The segmentation of the high reflectance areas can be applied to existing marks. Where the existing mark forms a grating, the segmentation is at a scale smaller than the pitch of the grating such that the existing alignment system disregards it and is able to directly measure the mask position in the known manner.

Further, existing alignment marks are formed on a substantially larger scale than the features imaged on the substrate. For example, a box-in-box type marker may have a size of 10 µm or more whereas the minimum dimension of features imaged on the substrate may be 0.1 µm. Thus, when the alignment marks are projected onto the substrate, the light diffracted by the alignment marks in the mask pattern will travel along different paths through the projection optics than light diffracted by the patterned features. The images of the alignment marks will therefore be subject to different aberrations than the images of the mask features and positional errors in the alignment marks may therefore not be the same as the positional errors in the patterned features. This imposes a limit on the accuracy with which overlay errors can be determined.

At least one embodiment of the invention can also take the form of a mark suitable for measuring overlay; in that case the mark may have the form of a large square. The square will in that case comprise a large number of smaller squares having a size comparable with the size of the structures to be exposed.

As an alternative one could measure the position of the different diffraction orders in the pupil plane of the projection system PL of a particular structure to be exposed in the lithographic apparatus. The positions in the pupil plane give information of the amount of diffraction that occurred with said particular structure. Subsequently, one could measure the position of the different diffraction orders in the pupil plane of an alignment mark and alter that alignment mark such that the position of the different diffraction orders in the pupil plane of the alignment mark and the structure to be exposed become similar. One could also use simulation software for obtaining a mark that diffracts to similar position in the pupil plane as a structure to be exposed in the lithographic projection apparatus. Again the reflective areas of the mark will be diffracted similar as the structures to be exposed in the lithographic projection apparatus and will suffer from the same aberrations in the projection system giving the same positional deviations and a better aligned position.

While specific embodiments of the invention have been described above, it will be appreciated that the invention may be practiced otherwise than as described. The description is not intended to limit the invention. The scope of the invention is intended to be limited only by the following claims.

What is claimed is:

1. A mask comprising a pattern for exposing an alignment mark, the alignment mark comprising:
    at least one relatively high reflectance area to reflect radiation of an alignment beam of radiation; and
    at least one relatively low reflectance area to reflect less radiation of the alignment beam,
    wherein the at least one high reflectance area is segmented in first and second directions, both directions being substantially perpendicular with respect to each other so that the at least one high reflectance area comprises predominantly rectangular segments.

2. A mask according to claim 1, wherein pre-selected ones of the rectangular segments are of a different size than others of said rectangular segments.

3. A mask according to claim 1, wherein the size and form of the segments into which the at least one high reflectance area is segmented are substantially equal to the size and form of features forming integrated circuits that are exposed in the process layer.

4. A mask according to claim 1, wherein at least one high reflectance area of the alignment mark forms a grating.

5. A mask according to claim 1, wherein the at least one high reflectance area comprises a square within which are disposed said rectangular segments.

6. A method of designing a mask to be used in projecting a mask pattern onto a substrate in a lithographic projection apparatus, the mask including at least one alignment mark, the alignment mark comprising relatively high reflectance areas and relatively low reflectance areas, the method comprising:
    determining a position in a pupil plane of a projection system of the lithographic projection apparatus of different diffraction orders of at least one structure in the mask pattern;

determining an appropriate segmentation of the high reflectance areas of the alignment mark such as to cause different diffraction orders of the alignment mark to be positioned at substantially the same positions in the pupil plane as the different diffraction orders of the at least one structure; and altering the pattern of the alignment mark in the mask pattern so as to be segmented as determined to be appropriate.

7. A method according to claim 6, wherein determining an appropriate segmentation is carried out using simulation software.

8. A method according to claim 6, further comprising embodying the designed mask pattern in a mask for use in a lithographic projection apparatus.

9. A mask comprising a pattern for exposing an alignment mark, the alignment mark comprising:

at least one relatively high reflectance area to reflect radiation of an alignment beam of radiation; and at least one relatively low reflectance area to reflect less radiation of the alignment beam, wherein the at least one high reflectance area includes a series of substantially parallel lines, wherein each line in said series includes a plurality of segments, said plurality of segments including segments having a first size and segments having a second size different than the first size.

10. A mask according to claim 9, wherein said plurality of segments is arranged in a plurality of rows extending in a first direction and a plurality of columns extending in a second direction different from the first direction.

11. A mask according to claim 9, wherein the at least one high reflectance area includes segments having a square shape.

12. A mask according to claim 9, wherein the size and form of each of the plurality of segments is substantially equal to the size and form of features forming integrated circuits that are exposed from the mask onto a substrate.

13. A mask according to claim 9, wherein at least one high reflectance area of the alignment mark forms a grating.

14. A mask according to claim 9, wherein the at least one high reflectance area comprises a square within which are disposed said plurality of segments.

15. A mask according to claim 9, wherein the first and second directions are substantially perpendicular with respect to each other.

16. A mask according to claim 9, wherein the plurality of segments comprises predominantly rectangular segments.

17. A mask according to claim 9, wherein each of the plurality of segments has a substantially rectangular shape.

18. A mask according to claim 9, wherein each of the plurality of segments is substantially square.

19. A mask according to claim 9, wherein each of the plurality of segments has substantially the same shape.

20. A mask according to claim 9, wherein a size of each of the plurality of segments in at least one of the first and second directions is not greater than one-half micron.

21. A mask provided with an alignment mark, the alignment mark comprising a series of substantially parallel lines, wherein each line in said series includes a plurality of segments, said plurality of segments including segments having a first size and segments having a second size different than the first size.

22. A mask according to claim 21, wherein the plurality of segments comprises predominantly rectangular segments.

23. A mask according to claim 21, wherein the size and form of each of the plurality of segments are substantially equal to the size and form of features forming integrated circuits that are exposed from the mask onto a substrate.

24. A mask according to claim 21, wherein the size and form of each of the plurality of segments are substantially equal to the size and form of features forming integrated circuits that are exposed from the mask onto a substrate.

25. A mask according to claim 22, wherein each of the plurality of segments is substantially square.

26. A mask according to claim 21, wherein the series of lines forms at least one grating.

27. A mask according to claim 21, wherein the alignment mark comprises one structural element in the form of a square.

28. A mask according to claim 21, wherein each of the plurality of segments has a substantially rectangular shape.

29. A mask according to claim 21, wherein each of the plurality of segments has substantially the same shape.

30. A mask provided with a mark belonging to the group consisting of an alignment mark and an overlay mark, the mark comprising a plurality of segments arranged in a plurality of rows extending in a first direction and a plurality of columns extending in a second direction different from the first direction, wherein said plurality of segments includes segments having a first size and segments having a second size different than the first size.

31. A mask according to claim 30, wherein the first and second directions are substantially perpendicular with respect to each other.

32. A mask according to claim 30, wherein the size and form of each of the plurality of segments are substantially equal to the size and form of features forming integrated circuits that are exposed from the mask onto a substrate.

33. A mask according to claim 31, wherein the plurality of segments comprises predominantly rectangular segments.

34. A mask according to claim 32, wherein each of the plurality of segments is substantially square.

35. A mask according to claim 30, wherein the overlay mark comprises a plurality of structural elements, which together form at least one grating, wherein each of the plurality of structural elements includes a plurality of segments arranged in a plurality of rows extending in a first direction and a plurality of columns extending in a second direction different from the first direction, said plurality of segments including segments having a first size and segments having a second size different than the first size.

* * * * *